United States Patent
Wei et al.

(10) Patent No.: US 12,432,931 B2
(45) Date of Patent: Sep. 30, 2025

(54) MEMORY CELL INCLUDING TWO SELECTORS AND METHOD OF MAKING SAME

(71) Applicant: Avalanche Technology, Inc., Fremont, CA (US)

(72) Inventors: Zhiqiang Wei, Pleasanton, CA (US); Zihui Wang, Mountain View, CA (US)

(73) Assignee: Avalanche Technology, Inc., Fremont, CA (US)

( * ) Notice: Subject to any disclaimer, the term of this patent is extended or adjusted under 35 U.S.C. 154(b) by 530 days.

(21) Appl. No.: 17/952,821

(22) Filed: Sep. 26, 2022

(65) Prior Publication Data

US 2024/0015986 A1    Jan. 11, 2024

Related U.S. Application Data

(60) Provisional application No. 63/358,227, filed on Jul. 5, 2022.

(51) Int. Cl.
*H10B 61/00* (2023.01)
*H10N 50/01* (2023.01)

(52) U.S. Cl.
CPC .............. *H10B 61/10* (2023.02); *H10N 50/01* (2023.02)

(58) Field of Classification Search
CPC .......... H10B 61/10; H10B 63/20; H10B 63/22
See application file for complete search history.

(56) References Cited

U.S. PATENT DOCUMENTS

| | | | |
|---|---|---|---|
| 6,944,052 B2 | 9/2005 | Subramanian et al. |
| 9,767,901 B1 | 9/2017 | Sharma et al. |
| 10,593,727 B2 | 3/2020 | Yang et al. |
| 2007/0159869 A1 | 7/2007 | Baek et al. |
| 2013/0070511 A1 | 3/2013 | Wells et al. |
| 2014/0146594 A1 | 5/2014 | Hayakawa et al. |
| 2014/0157065 A1 | 6/2014 | Ong |
| 2014/0209892 A1 | 7/2014 | Kuo et al. |
| 2014/0264224 A1 | 9/2014 | Zhang et al. |
| 2014/0319634 A1 | 10/2014 | Shukh |
| 2015/0311252 A1 | 10/2015 | Gan et al. |
| 2015/0325783 A1 | 11/2015 | Wang et al. |
| 2016/0020250 A1 | 1/2016 | Li et al. |

(Continued)

*Primary Examiner* — Shih Tsun A Chou
(74) *Attorney, Agent, or Firm* — Bing K. Yen (57) ABSTRACT

The present invention is directed to a memory cell including first and second unidirectional selectors coupled in parallel to a nonvolatile memory element. Each of the first and second unidirectional selectors includes first, second, and third electrode layers; a first insulator layer interposed between the first and second electrode layers; and a second insulator layer interposed between the second and third electrode layers. The first insulator layer of the first unidirectional selector includes therein a permanent conductive path and the second insulator layer of the first unidirectional selector is operable to form therein a volatile conductive path upon application of a potential across the first unidirectional selector. The second insulator layer of the second unidirectional selector includes therein another permanent conductive path and the first insulator layer of the second unidirectional selector is operable to form therein another volatile conductive path upon application of another potential across the second selector.

15 Claims, 10 Drawing Sheets

(56) References Cited

U.S. PATENT DOCUMENTS

| | | |
|---|---|---|
| 2017/0271406 A1 | 9/2017 | Yang et al. |
| 2019/0172871 A1 | 6/2019 | Yang et al. |
| 2020/0066984 A1* | 2/2020 | Liu .................... H10N 70/043 |
| 2020/0127046 A1* | 4/2020 | Lai ........................ H10N 50/10 |

* cited by examiner

FIG. 1 PRIOR ART

WRITING TO LOW RESISTANCE       WRITING TO HIGH RESISTANCE

MEMORY CELL INCLUDING TWO SELECTORS AND METHOD OF MAKING SAME

CROSS-REFERENCE TO RELATED APPLICATIONS

The present application claims priority to provisional application No. 63/358,227, filed on Jul. 5, 2022, the content of which is incorporated herein by reference in its entirety.

BACKGROUND

The present invention relates to nonvolatile memory, and more particularly, to a memory cell structure and a method for manufacturing the same.

Figure 1:
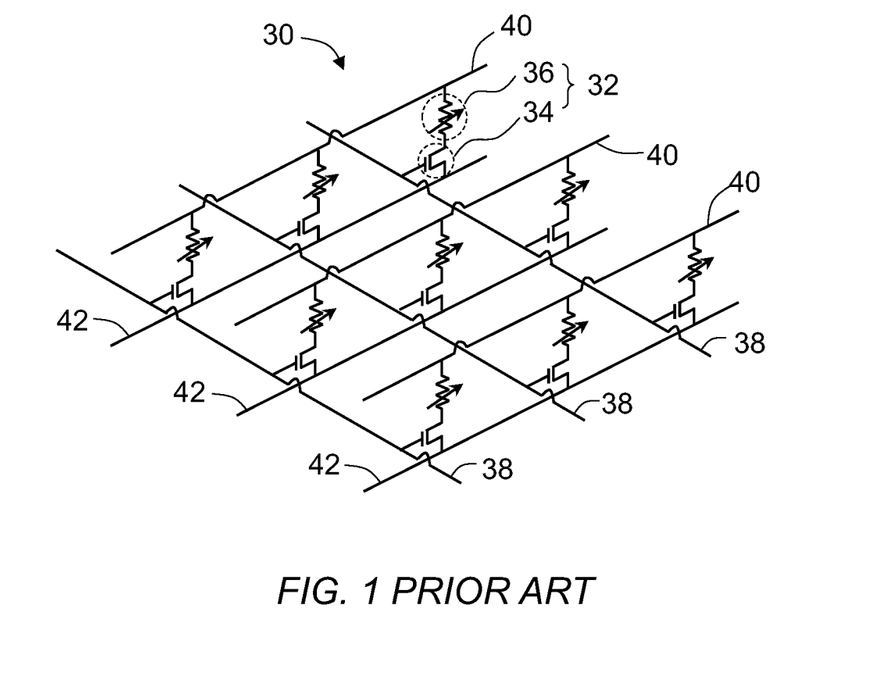
FIG. 1 is a schematic circuit diagram of a conventional STT-MRAM array incorporating access transistors in magnetic memory cells.

FIG. 1 is a schematic circuit diagram of a conventional nonvolatile memory array 30, which comprises a plurality of memory cells 32 with each of the memory cells 32 including an access transistor 34 coupled to a nonvolatile memory element 36; a plurality of parallel word lines 38 with each being coupled to the gates of a respective row of the access transistors 34 in a first direction; and a plurality of parallel bit lines 40 with each being coupled to a respective row of the nonvolatile memory elements 36 in a second direction substantially perpendicular to the first direction; and a plurality of parallel source lines 42 with each being coupled to a respective row of the access transistors 34 in the first or second direction.

Each nonvolatile memory element 36 and corresponding access transistor 34 are coupled in series between a bit line 40 and a source line 42. The access transistor 34 functions like a switch to direct current or voltage through the selected nonvolatile memory element 36 coupled thereto. Upon application of an appropriate voltage or current to the selected nonvolatile memory element 36, the electrical property of the nonvolatile memory element 36 would change accordingly, thereby switching the stored logic in the respective nonvolatile memory cell 32.

The nonvolatile memory element 36 may utilize resistance-switching mechanisms, like the memory elements of Phase Change Random Access Memory (PCRAM), Conductive Bridging Random Access Memory (CBRAM), and Magnetic Random Access Memory (MRAM).

The magnetic memory element of MRAM normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a nonvolatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

Figure 2A:
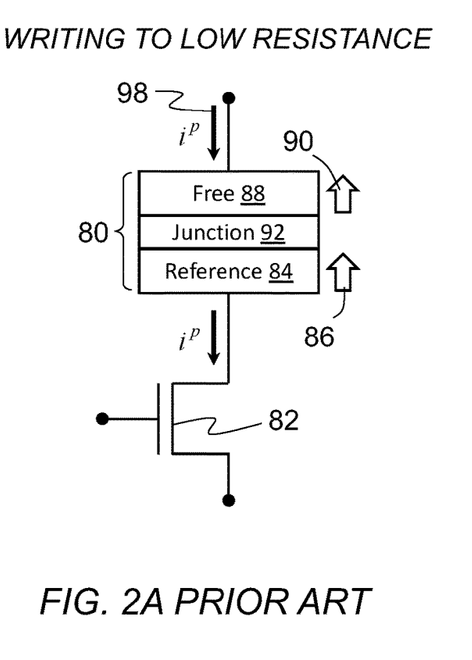
FIGS. 2A and 2B illustrate switching of magnetic tunnel junction from high to low resistance state and from low to high resistance state, respectively.
Figure 2B:
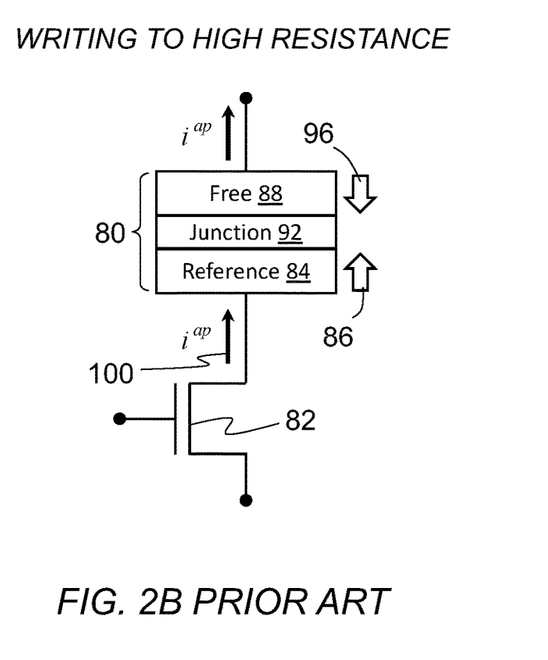

FIGS. 2A and 2B illustrate bipolar programming operations of an STT-MRAM cell including a perpendicular MTJ memory element 80 coupled to an access transistor 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 2A illustrates the writing process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90. It should be noted that the parallelizing write current ($i^P$) 98 flows in the opposite direction as the electrons.

Conversely, FIG. 2B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{aP}$) 100 exceeds a threshold level.

The cell size of the conventional STT-MRAM memory cell 32 is limited to about 8 $F^2$, where F denotes the minimum feature size or one half the minimum feature pitch normally associated with a particular manufacturing process because of the access transistor 34. Moreover, the fabrication of the conventional STT-MRAM array 30 is normally limited to a single layer, making the conventional memory uncompetitive compared to monolithic 3D memory, in which multiple layers of memory arrays are stacked on a substrate. While the access transistor 32 may be replaced by a two-terminal selector device to reduce the memory cell size down to 4 $F^2$ and enable stacking of multiple memory layers on a substrate, conventional bidirectional selector devices, such as Ovonic threshold switch, are prone to current leakage compared with access transistors.

For the foregoing reasons, there is a need for a nonvolatile memory architecture that has low current leakage and that can be inexpensively manufactured.

SUMMARY

The present invention is directed to a nonvolatile memory architecture that satisfies this need. A memory cell having features of the present invention includes a nonvolatile memory element and first and second unidirectional selectors coupled in parallel to the nonvolatile memory element. Each of the first and second unidirectional selectors includes first, second, and third electrode layers; a first insulator layer interposed between the first and second electrode layers; and a second insulator layer interposed between the second and third electrode layers. The first insulator layer of the first unidirectional selector includes therein a permanent conductive path and the second insulator layer of the first unidirectional selector is operable to form therein a volatile conductive path upon application of a potential across the first unidirectional selector. The second insulator layer of the second unidirectional selector includes therein another permanent conductive path and the first insulator layer of the second unidirectional selector is operable to form therein another volatile conductive path upon application of another potential across the second unidirectional selector. The first and second insulator layers of the first unidirectional selector are coplanar with the first and second insulator layers of the second unidirectional selector, respectively.

According to another aspect of the present invention, a method for making a memory cell comprising the steps of providing first and second selector structures coupled in parallel to a nonvolatile memory element, each of the first and second selector structures including first, second, and third electrode layers; a first insulator layer interposed between the first and second electrode layers; and a second insulator layer interposed between the second and third electrode layers, wherein the first and second insulator layers of the first selector structure are coplanar with the first and second insulator layers of the second selector structure, respectively; applying first and second voltages respectively to the first selector structure and the nonvolatile memory element to form a volatile conductive path in the second insulator layer of the first selector structure, wherein the first voltage is higher than the second voltage; increasing the voltage difference between the first and second voltages to form a permanent conductive path in the first insulator layer of the first selector structure; applying third and fourth voltages respectively to the second selector structure and the nonvolatile memory element to form another volatile conductive path in the first insulator layer of the second selector structure, wherein the third voltage is lower than the fourth voltage; and increasing the voltage difference between the third and fourth voltages to form another permanent conductive path in the second insulator layer of the second selector structure.

According to still another aspect of the present invention, a method for making a memory cell comprising the steps of providing first and second selector structures coupled in parallel to a nonvolatile memory element, each of the first and second selector structures including first, second, and third electrode layers; a first insulator layer interposed between the first and second electrode layers; and a second insulator layer interposed between the second and third electrode layers, wherein the first and second insulator layers of the first selector structure are coplanar with the first and second insulator layers of the second selector structure, respectively; applying first and second voltages respectively to the first selector structure and the nonvolatile memory element to form a volatile conductive path in the second insulator layer and a permanent conductive path in the first insulator layer of the first selector structure, wherein the first voltage is higher than the second voltage; and applying third and fourth voltages respectively to the second selector structure and the nonvolatile memory element to form another volatile conductive path in the first insulator layer and another permanent conductive path in the second insulator layer of the second selector structure, wherein the third voltage is lower than the fourth voltage.

BRIEF DESCRIPTION OF THE DRAWINGS

These and other features, aspects, and advantages of the present invention will become better understood with regard to the following description, appended claims, and accompanying drawings where:

DETAILED DESCRIPTION

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention, except where the context excludes that possibility.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

An embodiment of the present invention as applied to a nonvolatile memory cell structure will now be described with reference to FIG. 3A and the corresponding schematic circuit diagram in FIG. 3B. The nonvolatile memory cell 100 includes a first unidirectional selector 102 and a second unidirectional selector 102' coupled in parallel to a nonvolatile memory element 104. The cathode end of the first unidirectional selector 102 is connected to or facing the nonvolatile memory element 104, while the anode end of the second unidirectional selector 102' is connected to or facing the nonvolatile memory element 104. Therefore, the first and second unidirectional selectors 102 and 102' have opposite forward-biased directions.

Figure 3A:
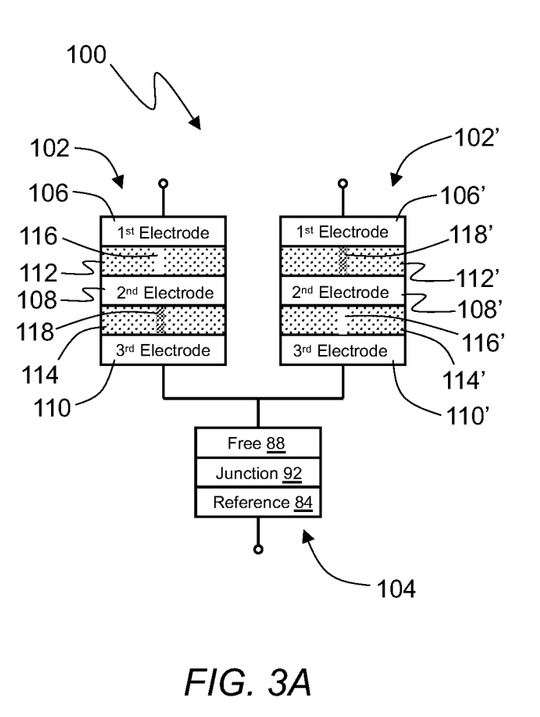
FIGS. 3A and 3B are cross-sectional view and corresponding circuit diagram of a memory cell in accordance with an embodiment of the present invention.
Figure 3B:
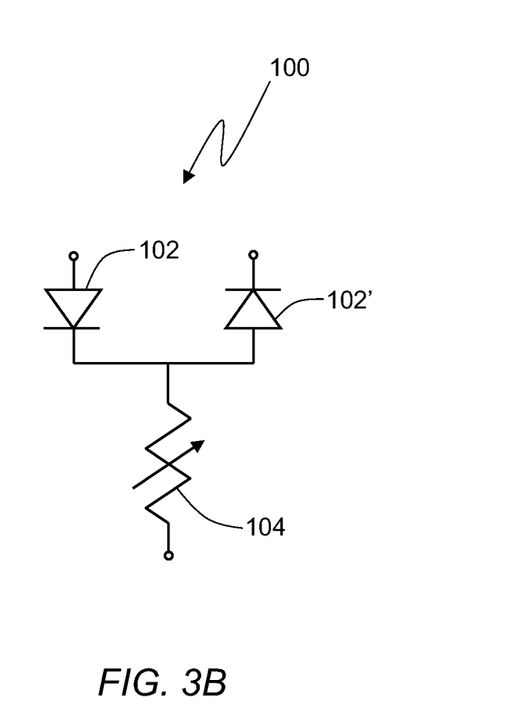

Referring now to FIG. 3A, the first unidirectional selector 102 includes first, second, and third electrode layers 106, 108, and 110, a first insulator layer 112 interposed between the first and second electrode layers 106 and 108, and a second insulator layer 114 interposed between the second and third electrode layers 108 and 110. The first insulator layer 112 includes therein a permanent conductive path 116. The second insulator layer 114 is configured or operable to form therein a volatile conductive path 118 upon application of a sufficiently high potential across the first unidirectional selector 102.

The second unidirectional selector 102' includes first, second, and third electrode layers 106', 108', and 110', a first insulator layer 112' interposed between the first and second electrode layers 106' and 108', and a second insulator layer 114' interposed between the second and third electrode layers 108' and 110'. The second insulator layer 114' includes therein another permanent conductive path 116'. The first insulator layer 112' is configured or operable to form therein another volatile conductive path 118' upon application of another sufficiently high potential across the second unidirectional selector 102'.

Each pair of the first electrode layers 106 and 106', the first insulator layers 112 and 112', the second electrode layers 108 and 108', the second insulator layer 114 and 114', and the third electrode layers 110 and 110' may be coplanar and simultaneously fabricated using the same processing steps.

The first electrode layers 106 and 106' may be made of a relatively inert electrode material, such as but not limited to gold (Au), platinum (Pt), palladium (Pd), rhodium (Rh), iridium (Ir), ruthenium (Ru), osmium (Os), rhenium (Re), titanium nitride ($TiN_x$), zirconium nitride ($ZrN_x$), tantalum nitride ($TaN_x$), niobium nitride ($NbN_x$), or any combination thereof. The third electrode layers 110 and 110' may also be made of a relatively inert electrode material, such as but not limited to gold (Au), platinum (Pt), palladium (Pd), rhodium (Rh), iridium (Ir), ruthenium (Ru), osmium (Os), rhenium (Re), titanium nitride ($TiN_x$), zirconium nitride ($ZrN_x$), tantalum nitride ($TaN_x$), niobium nitride ($NbN_x$), or any combination thereof. The nitrides described above may be stoichiometric or nonstoichiometric.

The second electrode layers 108 and 108' may be made of a relatively active electrode material, such as but not limited to nickel (Ni), copper (Cu), silver (Ag), zinc (Zn), cobalt (Co), iron (Fe), tungsten (W), molybdenum (Mo), tantalum (Ta), niobium (Nb), aluminum (Al), titanium (Ti), zirconium (Zr), arsenic (As), or any combination thereof. Alternatively, the second electrode layers 108 and 108' may have a composite structure comprising clusters of the active electrode material described above distributed in a matrix that is conductive, semiconductive, or insulative. The conductive matrix may comprise any one of gold (Au), platinum (Pt), palladium (Pd), rhodium (Rh), iridium (Ir), ruthenium (Ru), osmium (Os), rhenium (Re), titanium nitride ($TiN_x$), zirconium nitride ($ZrN_x$), tantalum nitride ($TaN_x$), niobium nitride ($NbN_x$), or any combination thereof. The semiconductive matrix may comprise any one of silicon (Si), germanium (Ge), tellurium (Te), or any combination thereof. The insulative matrix may comprise any one of silicon oxide ($SiO_x$), silicon nitride ($SiN_x$), aluminum oxide ($AlO_x$), magnesium oxide ($MgO_x$), tantalum oxide ($TaO_x$), vanadium oxide ($VO_x$), niobium oxide ($NbO_x$), titanium oxide ($TiO_x$), chromium oxide ($CrO_x$), hafnium oxide ($HfO_x$), zirconium oxide ($ZrO_x$), nickel oxide ($NiO_x$), or any combination thereof. The nitrides and oxides described above for the matrix may be stoichiometric or nonstoichiometric.

The first insulator layers 112 and 112' may comprise a stoichiometric oxide or a near-stoichiometric oxide, such as but not limited to silicon oxide ($SiO_2$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), chromium oxide ($Cr_2O_3$), hafnium oxide (HfO$_2$), zirconium oxide (ZrO$_2$), or any combination thereof. The first insulator layers 112 and 112' may alternatively comprise a stoichiometric nitride or near-stoichiometric nitride, such as silicon nitride (Si$_3$N$_4$). The second insulator layers 114 and 114' may also comprise a stoichiometric or near-stoichiometric oxide, such as but not limited to silicon oxide (SiO$_2$), aluminum oxide (Al$_2$O$_3$), magnesium oxide (MgO), tantalum oxide (Ta$_2$O$_5$), vanadium oxide (V$_2$O$_5$), niobium oxide (Nb$_2$O$_5$), titanium oxide (TiO$_2$), chromium oxide (Cr$_2$O$_3$), hafnium oxide (HfO$_2$), zirconium oxide (ZrO$_2$), or any combination thereof. The second insulator layers 114 and 114' may alternatively comprise a stoichiometric or near-stoichiometric nitride, such as silicon nitride (Si$_3$N$_4$).

The permanent conductive paths 116 and 116' may each be in the form of one or more conductive filaments electrically connecting two adjacent electrode layers. The presence of the permanent conductive paths 116 and 116' allows current leakage through the first insulator layer 112 and the second insulator layer 114'. The permanent conductive paths 116 and 116' in the insulator layers 112 and 114' may be localized oxygen-deficient or metal-rich regions in the respective insulator layers. After the insulator layers 112 and 114' are deposited and patterned, the permanent conductive paths 116 and 116' may be electrically formed or fabricated using a process to be described later.

The volatile conductive paths 118 and 118' may respectively form in the second insulator layer 114 and the first insulator layer 112' when appropriate voltages are applied to the first and second unidirectional selectors 102 and 102'. The volatile conductive paths 118 and 118' may disappear or dissolve in the absence of the applied voltages, thereby effectively making the second insulator layer 114 and the first insulator layer 112' volatile switching layers. The volatile conductive paths 118 and 118' may each be in the form of one or more conductive filaments electrically connecting two adjacent electrode layers and comprise atoms or ions from the active electrode material of the second electrode 108, 108', such as but not limited to nickel (Ni), copper (Cu), silver (Ag), zinc (Zn), cobalt (Co), iron (Fe), tungsten (W), molybdenum (Mo), tantalum (Ta), niobium (Nb), aluminum (Al), titanium (Ti), zirconium (Zr), arsenic (As), or any combination thereof. After the insulator layers 114 and 112' are deposited and patterned, the volatile conductive paths 118 and 118' may be electrically formed or fabricated using a process to be described later.

The nonvolatile memory element 104 may change the resistance state thereof by any suitable switching mechanism, such as but not limited to phase change, precipitate bridging, magnetoresistive switching, or any combination thereof. In one embodiment, the nonvolatile memory element 104 comprises a phase change chalcogenide compound, such as but not limited to Ge$_2$Sb$_2$Te$_5$ or AgInSbTe, which can switch between a resistive phase and a conductive phase. In another embodiment, the nonvolatile memory element 104 comprises a nominally insulating metal oxide material, such as but not limited to NiO, TiO$_2$, or Sr(Zr)TiO$_3$, which can switch to a lower electrical resistance state as metal rich precipitates grow and link to form conductive paths upon application of an appropriate voltage. In still another embodiment, the nonvolatile memory element 104 comprises a magnetic free layer 88, a magnetic reference layer 84, and an insulating electron tunnel junction layer 92 interposed therebetween, collectively forming a magnetic tunnel junction (MTJ). The stacking order of the magnetic free layer 88, the insulating electron tunnel junction layer 92, and the magnetic reference layer 84 may be reversed such that the magnetic reference layer 84 is disposed adjacent to the unidirectional selectors 102 and 102'. When a switching current is applied to the MTJ, the magnetic free layer 88 would switch the magnetization direction thereof, thereby changing the electrical resistance of the MTJ. The magnetic free layer 88 may have a variable magnetization direction substantially perpendicular to a layer plane thereof. The magnetic reference layer 84 may have a fixed magnetization direction substantially perpendicular to a layer plane thereof. Alternatively, the magnetization directions of the magnetic free and reference layers 88 and 84 may have orientations that are substantially parallel to the layer planes thereof.

Figure 4A:
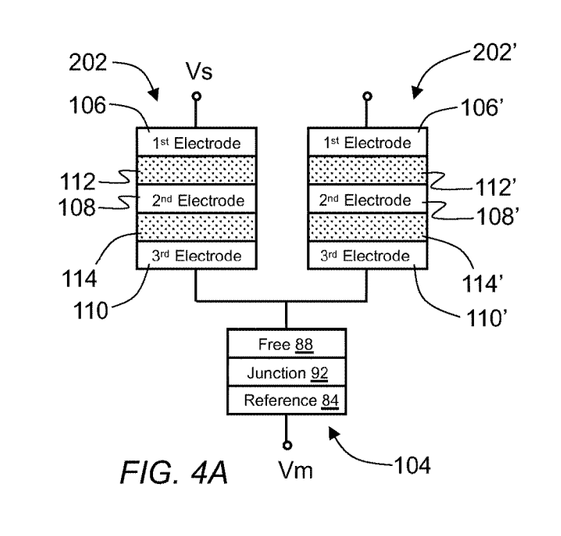
FIG. 4A is a cross-sectional view showing first and second selector structures coupled in parallel to a nonvolatile memory element.

An embodiment of the present invention as applied to formation of the permanent conductive paths 116 and 116' and the volatile conductive paths 118 and 118' will now be described with reference to FIGS. 4A-4E and 5A-5E. Referring now to FIG. 4A, the process begins by first providing first and second selector structures 202 and 202' coupled in parallel to the nonvolatile memory element 104. The first selector structure 202 includes the first, second, and third electrode layers 106-110, a first insulator layer 112 interposed between the first and second electrode layers 106 and 108, and a second insulator layer 114 interposed between the second and third electrode layers 108 and 110. The second selector structure 202' includes the first, second, and third electrode layers 106'-110', a first insulator layer 112' interposed between the first and second electrode layers 106' and 108', and a second insulator layer 114' interposed between the second and third electrode layers 108' and 110'. Each pair of the first electrode layers 106 and 106', the first insulator layers 112 and 112', the second electrode layers 108 and 108', the second insulator layer 114 and 114', and the third electrode layers 110 and 110' may be coplanar and simultaneously fabricated using the same processing steps.

Figure 4B:
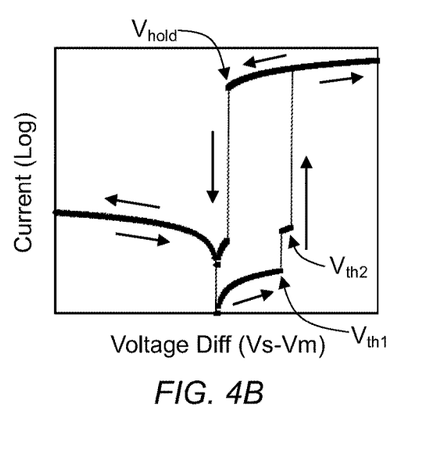
FIG. 4B is an I-V response plot showing the current passing through the first selector structure and the nonvolatile memory element as a function of the voltage difference across the two devices.
Figure 4C:
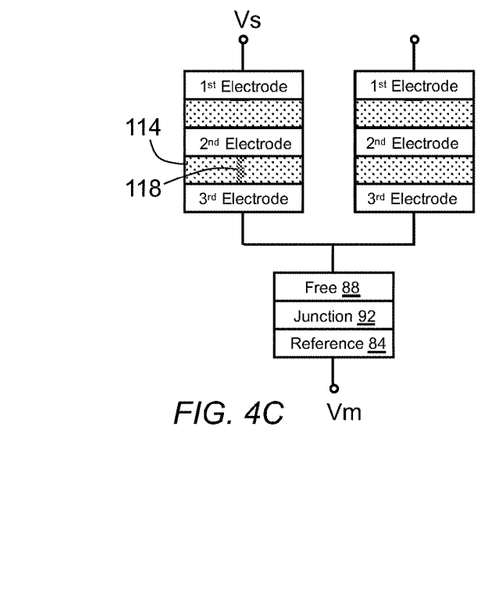
FIGS. 4C-4E are cross-sectional views illustrating various stages in formation of a first unidirectional selector in accordance with a method embodiment of the present invention.

The process of forming the volatile conductive path 118 and the permanent conductive path 116 in the first selector structure 202 continues, with reference to FIG. 4A, by applying voltages Vs and Vm to the first selector structure 202 and the nonvolatile memory element 104, respectively. FIG. 4B is an I-V response plot showing the current passing through the first selector structure 202 and the nonvolatile memory element 104 as a function of the voltage difference across the two devices (i.e., Vs−Vm). Initially, there is little current increase with increasing voltage difference because the first and second insulator layers 112 and 114 prevent electrical conduction. When the voltage difference reaches a first threshold voltage, $V_{th1}$, the current jumps or rapidly increases owing to the possible formation of the volatile conductive path 118 in the second insulator layer 114 as illustrated in FIG. 4C. The volatile conductive path 118 may comprise one or more filaments of atoms or ions from the active electrode material of the second electrode 108 driven into the second insulator layer 114 by the applied voltage difference.

Figure 4D:
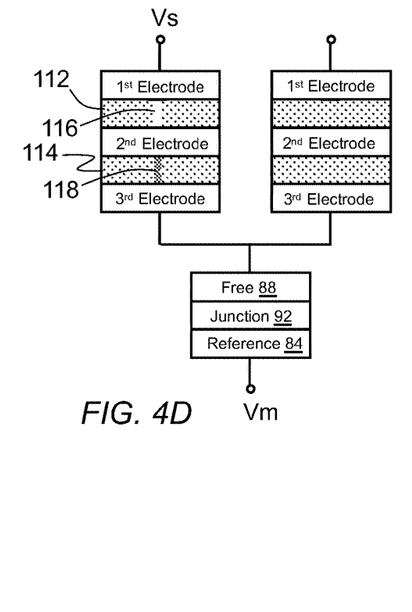

With continuing reference to FIG. 4B, after the first jump at $V_{th1}$ and the possible formation of the volatile conductive path 118 in the second insulator layer 114, the current only slightly increases with increasing voltage difference because the presence of the first insulator layer 112 still makes the first insulator structure 202 relatively insulating. Therefore, the voltage drop across the first selector structure 202 occurs mainly over the first insulator layer 112. When the voltage difference reaches a second threshold voltage, $V_{th2}$, the current jumps or rapidly increases owing to the possible formation of the permanent conductive path 116 in the first insulator layer 112 as shown in FIG. 4D. The permanent conductive path 116 may comprise localized oxygen-deficient or metal-rich regions in the first insulator layer 112 caused by the local migration of oxygen atoms or ions driven by the applied voltage difference. After the second current jump at $V_{th2}$, the first selector structure 202 essentially becomes conductive. Further increase in the voltage difference causes gradual increase in current as the first selector structure 202 remains conductive.

Figure 4E:
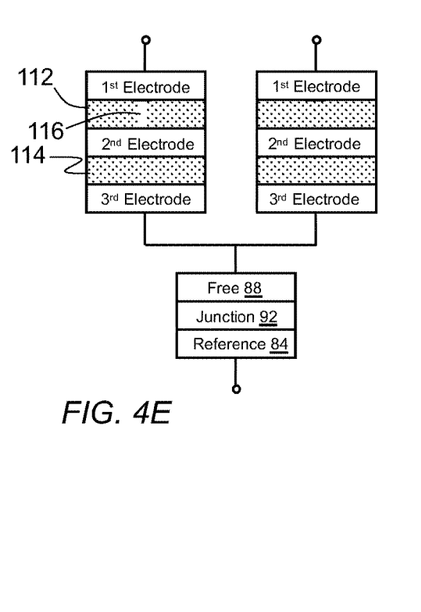

FIG. 4B shows that when the increase in the voltage difference is reversed, the first selector structure 202 remains conductive until reaching a holding voltage, $V_{hold}$, which is lower than $V_{th1}$ or $V_{th2}$ but higher than 0 V. At $V_{hold}$, the current rapidly drops as the first selector structure 202 reverts to an insulating state, which may be caused by the disappearance of the volatile conductive path 118 as shown in FIG. 4E. Unlike the permanent conductive path 116 in the first insulator layer 112, the maintenance of the volatile conductive path 118 requires a minimum voltage, below which the atoms or ions from the active electrode material forming the filaments may diffuse back to the second electrode 108. Therefore, the I-V response plot illustrated in FIG. 4B is characterized by a hysteresis behavior. The first selector structure 202 remains insulating at voltages below $V_{hold}$, including negative voltages (i.e., Vs−Vm<0), because the permanent conductive path 116 in the first insulator layer 112 prevents the formation of another volatile conductive path in the same layer 112 when Vm is greater than Vs.

Figure 5A:
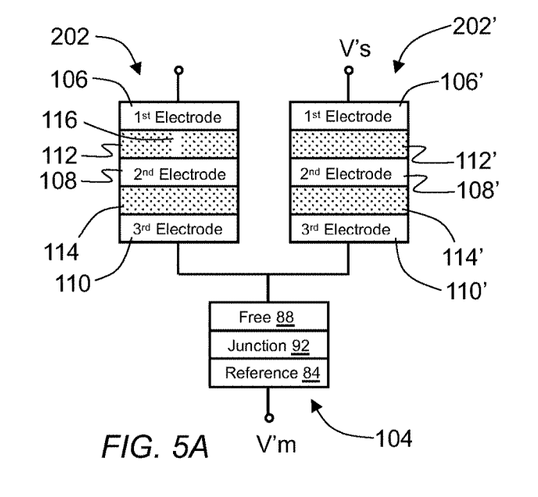
FIG. 5A is a cross-sectional view showing the first and second selector structures coupled in parallel to the nonvolatile memory element after formation of the permanent conductive path in the first selector structure.
Figure 5B:
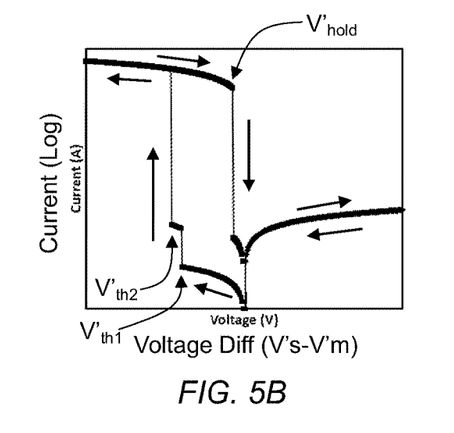
FIG. 5B is an I-V response plot showing the current passing through the second selector structure and the nonvolatile memory element as a function of the voltage difference across the two devices.
Figure 5C:
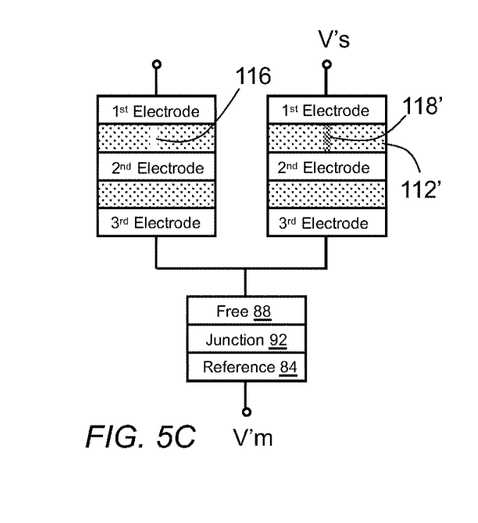
FIGS. 5C-5E are cross-sectional views illustrating various stages in formation of a second unidirectional selector in accordance with a method embodiment of the present invention.

After the formation of the permanent conductive path 116 in the first insulator layer 112 of the first selector structure 202, the volatile conductive path 118' and the permanent conductive path 116' in the second selector structure 202' may be formed by applying voltages V's and V'm to the second selector structure 202 and the nonvolatile memory element 104, respectively, as shown in FIG. 5A. FIG. 5B is an I-V response plot showing the current passing through the nonvolatile memory element 104 and the second selector structure 202' as a function of the voltage difference across the two devices (i.e., V's−V'm). Initially, there is little current increase with negatively increasing voltage difference because the first and second insulator layers 112' and 114' prevent electrical conduction. When the voltage difference reaches a first threshold voltage, $V'_{th1}$, the current jumps or rapidly increases owing to the possible formation of the volatile conductive path 118' in the first insulator layer 112' as illustrated in FIG. 5C. The volatile conductive path 118' may comprise one or more filaments of atoms or ions from the active electrode material of the second electrode 108' driven into the first insulator layer 112' by the applied voltage difference.

Figure 5D:
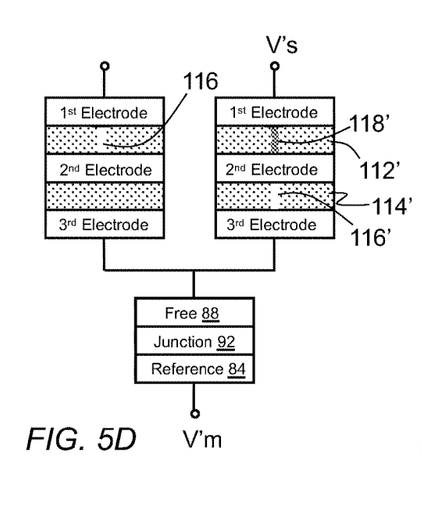

With continuing reference to FIG. 5B, after the first jump at $V'_{th1}$ and the possible formation of the volatile conductive path 118' in the first insulator layer 112', the current only slightly increases with negatively increasing voltage difference because the presence of the second insulator layer 114' still makes the second insulator structure 202' relatively insulating. Therefore, the voltage drop across the second selector structure 202' occurs mainly over the second insulator layer 114'. When the voltage difference reaches a second threshold voltage, $V'_{th2}$, the current jumps or rapidly increases owing to the possible formation of the permanent conductive path 116' in the second insulator layer 114' as shown in FIG. 5D. The permanent conductive path 116' may comprise localized oxygen-deficient or metal-rich regions in the second insulator layer 114' caused by the local migration of oxygen atoms or ions driven by the applied voltage difference. After the second current jump at $V'_{th2}$, the second selector structure 202' essentially becomes conductive. Further increase in the voltage difference causes gradual increase in current as the second selector structure 202' remains conductive.

Figure 5E:
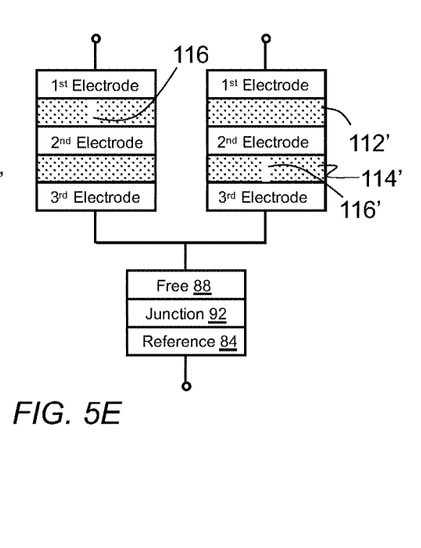

FIG. 5B shows that when the negative increase in the voltage difference is reversed, the second selector structure 202' remains conductive until reaching a holding voltage, $V'_{hold}$, which is positively higher or negatively lower than $V'_{th1}$ or $V'_{th2}$ but positively lower or negatively higher than 0 V. At $V'_{hold}$, the current rapidly drops as the second selector structure 202' reverts to an insulating state, which may be caused by the disappearance of the volatile conductive path 118' as shown in FIG. 5E. Unlike the permanent conductive path 116' in the second insulator layer 114', the maintenance of the volatile conductive path 118' requires a minimum voltage, below which the atoms or ions from the active electrode material forming the filaments may diffuse back to the second electrode 108'. Therefore, the I-V response plot illustrated in FIG. 5B is characterized by a hysteresis behavior. The second selector structure 202' remains insulating at voltages negatively below or positively above $V'_{hold}$, including positive voltages (i.e., V's−V'm>0), because the permanent conductive path 116' in the second insulator layer 114' prevents the formation of another volatile conductive path in the same layer 114' when V's is positively higher than V'm.

Figure 6:
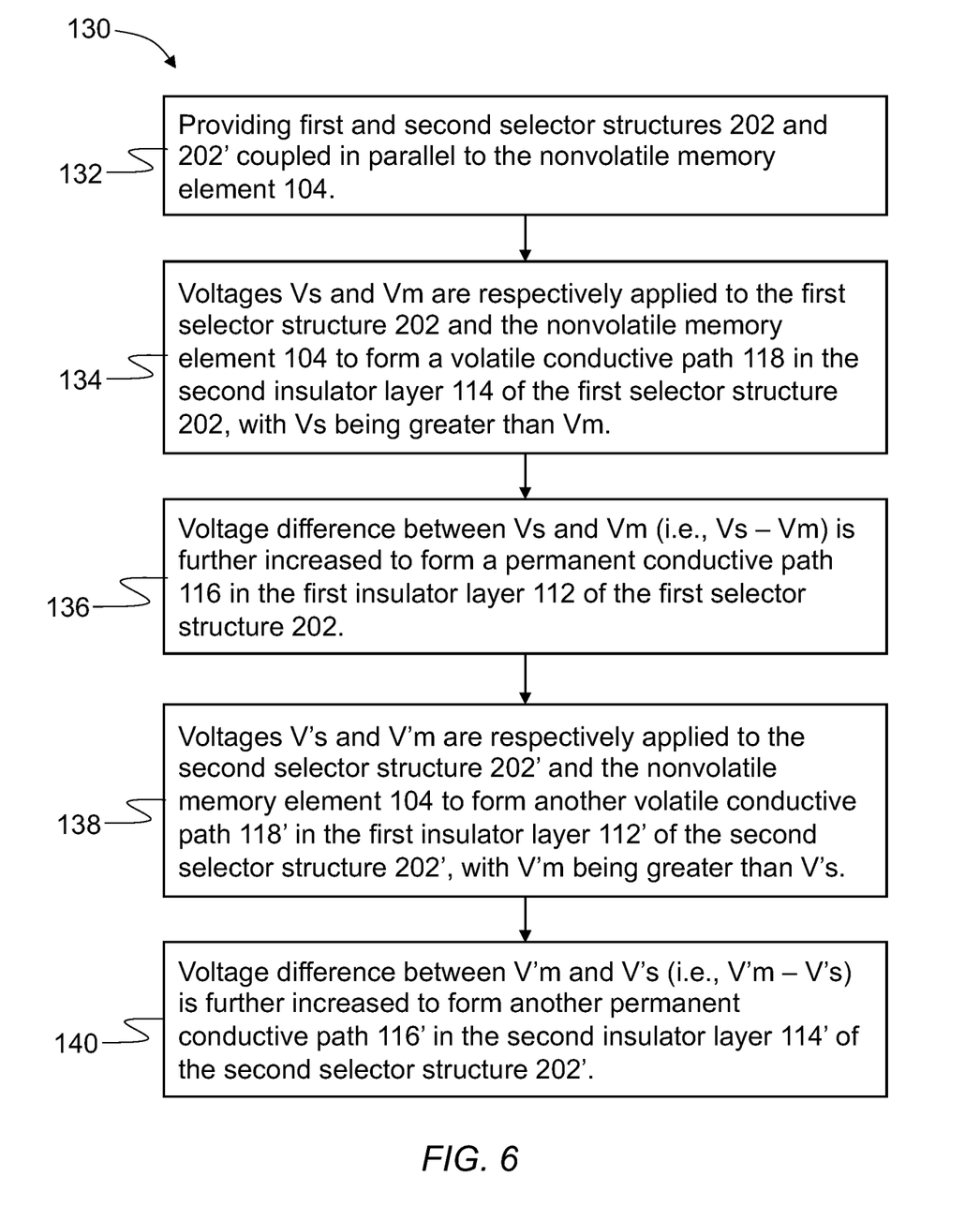
FIG. 6 is a flow chart illustrating selected steps for making a memory cell in accordance with a method embodiment of the present invention.

A flow chart illustrating selected steps 130 for a method of making a memory cell in accordance with the embodiments of FIGS. 4 and 5 is shown in FIG. 6. The fabrication steps 130 begin by providing first and second selector structures 202 and 202' coupled in parallel to the nonvolatile memory element 104 at step 132. The first selector structure 202 includes the first, second, and third electrode layers 106-110, a first insulator layer 112 interposed between the first and second electrode layers 106 and 108, and a second insulator layer 114 interposed between the second and third electrode layers 108 and 110. The second selector structure 202' includes the first, second, and third electrode layers 106'-110', a first insulator layer 112' interposed between the first and second electrode layers 106' and 108', and a second insulator layer 114' interposed between the second and third electrode layers 108' and 110'. Each pair of the first electrode layers 106 and 106', the first insulator layers 112 and 112', the second electrode layers 108 and 108', the second insulator layer 114 and 114', and the third electrode layers 110 and 110' may be coplanar and simultaneously fabricated using the same processing steps.

Next, at step 134, voltages Vs and Vm are respectively applied to the first selector structure 202 and the nonvolatile memory element 104 to form a volatile conductive path 118 in the second insulator layer 114 of the first selector structure 202, with Vs being greater than Vm.

Following step 134, the process continues to step 136, where the voltage difference between Vs and Vm (i.e., Vs−Vm) is further increased to form a permanent conductive path 116 in the first insulator layer 112 of the first selector structure 202.

At step 138, voltages V's and V'm are respectively applied to the second selector structure 202' and the nonvolatile memory element 104 to form another volatile conductive path 118' in the first insulator layer 112' of the second selector structure 202', with V'm being greater than V's.

Following step 138, the process continues to step 140, where the voltage difference between V'm and V's (i.e., V'm−V's) is further increased to form another permanent conductive path 116' in the second insulator layer 114' of the second selector structure 202'. After the completion of the processing steps 134-140, the first and second selector structures 202 and 202' become the first and second unidirectional selectors 102 and 102', respectively.

Alternatively, the formation of the volatile conductive path 118' at step 138 and the permanent conductive path 116' at step 140 for the second selector structure 202' may come before the formation of the volatile conductive path 118 at step 134 and the permanent conductive path 116 at step 136 for the first selector structure 202. Therefore, the sequence of fabrication steps may be steps 132, 138, 140, 134, and 136.

Moreover, steps 134 and 136 may be combined by applying a sufficiently large voltage difference across the first selector structure 202 and the nonvolatile memory element 104 to form a volatile conductive path 118 in the second insulator layer 114 and a permanent conductive path 116 in the first insulator layer 112 of the first selector structure 202. Similarly, steps 138 and 140 may be combined by applying a sufficiently large voltage difference across the nonvolatile memory element 104 and the second selector structure 202' to form another volatile conductive path 118' in the first insulator layer 112' and another permanent conductive path 116' in the second insulator layer 114' of the second selector structure 202'.

Figure 7:
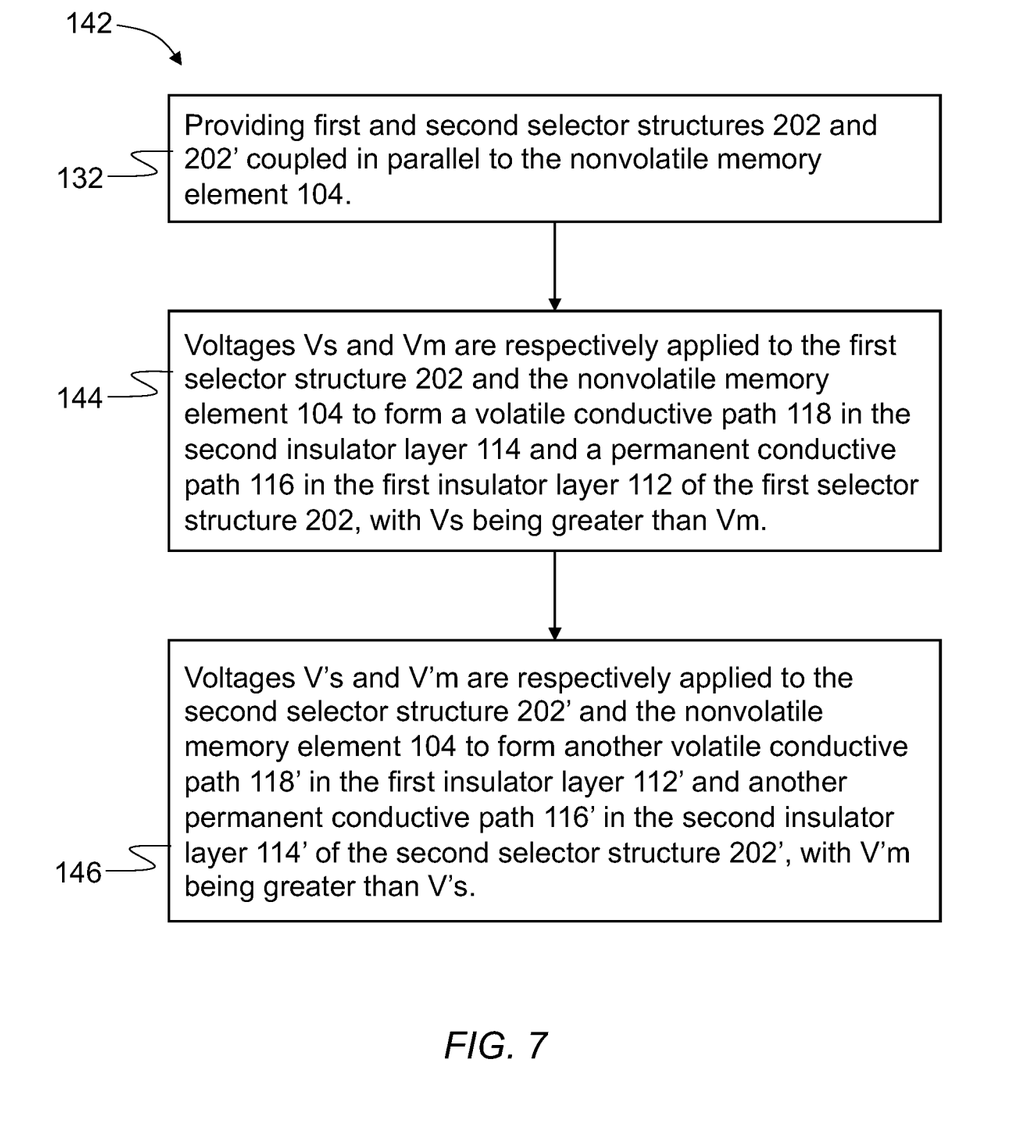
FIG. 7 is a flow chart illustrating selected steps for making a memory cell in accordance with another method embodiment of the present invention.

Accordingly, a method of making a memory cell in accordance with another embodiment of the present invention is illustrated by the flow chart 142 in FIG. 7. The fabrication steps 142 begin by providing first and second selector structures 202 and 202' coupled in parallel to the nonvolatile memory element 104 at step 132 as described above.

Next, at step 144, voltages Vs and Vm are respectively applied to the first selector structure 202 and the nonvolatile memory element 104 to form a volatile conductive path 118 in the second insulator layer 114 and a permanent conductive path 116 in the first insulator layer 112 of the first selector structure 202, with Vs being greater than Vm.

Next, at step 146, voltages V's and V'm are respectively applied to the second selector structure 202' and the nonvolatile memory element 104 to form another volatile conductive path 118' in the first insulator layer 112' and another permanent conductive path 116' in the second insulator layer 114' of the second selector structure 202', with V'm being greater than V's.

Again, the formation of the volatile conductive path 118' and the permanent conductive path 116' in the second selector structure 202' at step 146 may come before the formation of the volatile conductive path 118 and the permanent conductive path 116 in the first selector structure 202 at step 144 since the two fabrication steps are relatively independent of each other.

Figure 8A:
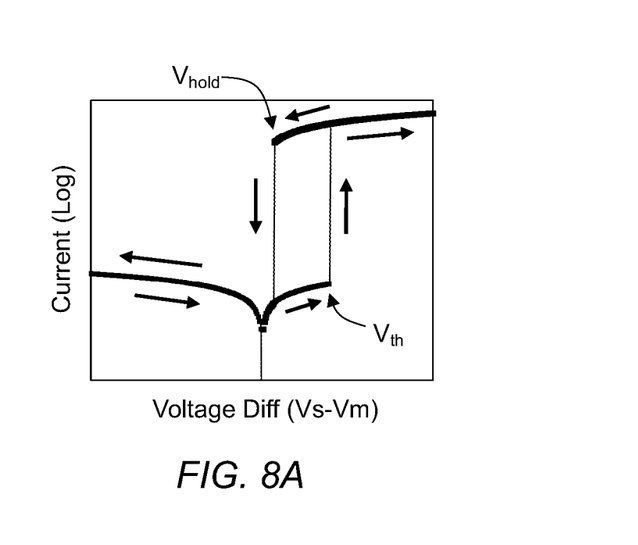
FIG. 8A is an I-V response plot showing the current passing through the first unidirectional selector and the nonvolatile memory element as a function of the voltage difference across the two devices.
Figure 8B:
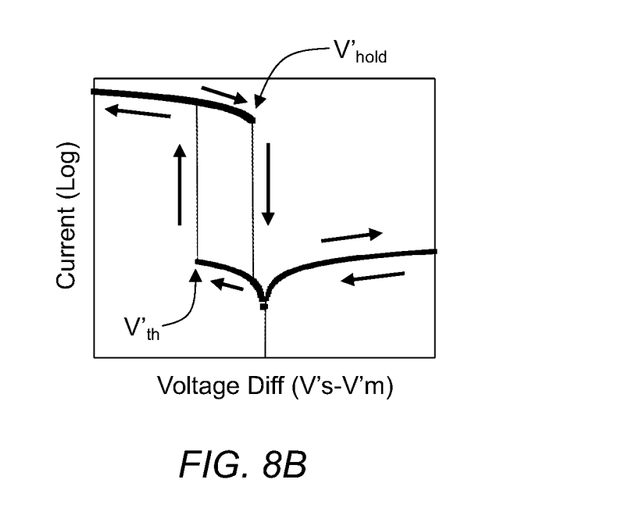
FIG. 8B is an I-V response plot showing the current passing through the second unidirectional selector and the nonvolatile memory element as a function of the voltage difference across the two devices.

After the formation of the the permanent conductive paths 116 and 116', the first and second unidirectional selectors 102 and 102' of the nonvolatile memory cell 100 may be characterized by the I-V response plots of FIGS. 8A and 8B, respectively. The I-V response plot of FIG. 8A shows the current passing through the first unidirectional selector 102 and the nonvolatile memory element 104 as a function of the voltage difference across the two devices (i.e., Vs–Vm). Initially, there is little current increase with increasing voltage difference because the second insulator layer 114 prevents electrical conduction. When the voltage difference reaches a threshold voltage, $V_{th}$, the current jumps or rapidly increases owing to the possible formation of the volatile conductive path 118 in the second insulator layer 114. The first unidirectional selector 102 essentially becomes conductive when the voltage difference reaches $V_{th}$. Further increase in the voltage difference causes gradual increase in current as the first unidirectional selector 102 remains conductive. After becoming conductive, the first unidirectional selector 102 remains conductive as the voltage difference is reduced until reaching a holding voltage, $V_{hold}$, which is lower than $V_{th}$ but higher than 0 V. At $V_{hold}$, the current rapidly drops as the first unidirectional selector 102 reverts to the insulating state, which may be caused by the disappearance of the volatile conductive path 118 in the second insulator layer 114. The first unidirectional selector 102 remains insulating at voltages below $V_{hold}$, including negative voltages (i.e., Vs–Vm<0).

The I-V response plot of FIG. 8B shows the current passing through the nonvolatile memory element 104 and the second unidirectional selector 102' as a function of the voltage difference across the two devices (i.e., V's–V'm). Initially, there is little current increase with negatively increasing voltage difference because the first insulator layer 112' prevents electrical conduction. When the voltage difference reaches a threshold voltage, $V'_{th}$, the current jumps or rapidly increases owing to the possible formation of the volatile conductive path 118' in the first insulator layer 112'. The second unidirectional selector 102' essentially becomes conductive when the voltage difference reaches $V'_{th}$. Further increase in the voltage difference causes gradual increase in current as the second unidirectional selector 102' remains conductive. After becoming conductive, the second unidirectional selector 102' remains conductive as the voltage difference is reduced until reaching a holding voltage, $V'_{hold}$, which is between $V'_{th}$ and 0 V. At $V'_{hold}$, the current rapidly drops as the second unidirectional selector 102' reverts to the insulating state, which may be caused by the disappearance of the volatile conductive path 118' in the first insulator layer 112'. The second unidirectional selector 102' remains insulating at voltages negatively below or positively above $V'_{hold}$, including positive voltages (i.e., V's–V'm>0).

Figure 9:
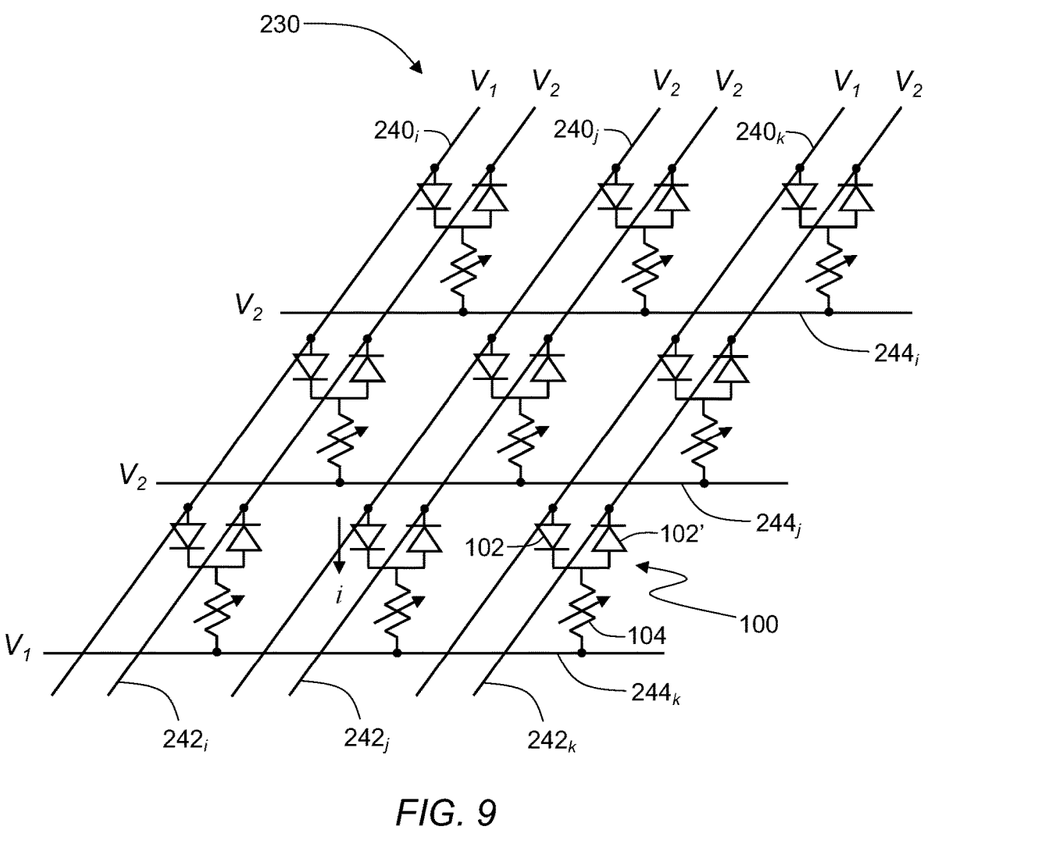
FIG. 9 is a schematic circuit diagram of a nonvolatile memory array incorporating the memory cells of the present invention that illustrates a method for flowing a current through a selected memory cell.

An embodiment of the present invention as applied to a memory array 230 comprising a plurality of the nonvolatile memory cells 100 will now be described with reference to FIG. 9. Each nonvolatile memory cell 100 includes the first and second unidirectional selectors 102 and 102' coupled in parallel to the nonvolatile memory element 104, with the cathode end of the first unidirectional selector 102 and the anode end of the second unidirectional selector 102' facing the nonvolatile memory element 104. The memory array 230 further comprises a plurality of first conductive lines $240_i$-$240_k$ connecting to anode ends of the first unidirectional selectors 102 of the nonvolatile memory cells 100 along a first direction, a plurality of second conductive lines $242_i$-$242_k$ connecting to cathode ends of the second unidirectional selectors 102' of the nonvolatile memory cells 100 along the first direction, and a plurality of third conductive lines $244_i$-$244_k$ connecting to the nonvolatile memory elements 104 of the nonvolatile memory cells 100 along a second direction substantially perpendicular to the first direction.

A current (i) can be passed through a selected nonvolatile memory cell 100 in both directions for read or write operation when appropriate voltages are applied to the conductive lines 240-244. For example, as shown in FIG. 9, to pass a current (i) through the first unidirectional selector 102 and the nonvolatile memory element 104 of the cell 100 disposed at the intersection of the conductive lines $240_j$, $242_j$, and $244_k$, voltages of $V_2$ and $V_1$ are applied to the first and third conductive lines $240_j$ and $244_k$, respectively. The voltage difference between $V_2$ and $V_1$ (i.e., $V_2$–$V_1$) is sufficiently high to make the first unidirectional selector 102 conductive. All other first conductive lines $240_i$, $240_k$ are held at $V_1$. All other third conductive lines $244_i$, $244_j$ and all second conductive lines $242_i$-$242_k$ are held at $V_2$.

Figure 10:
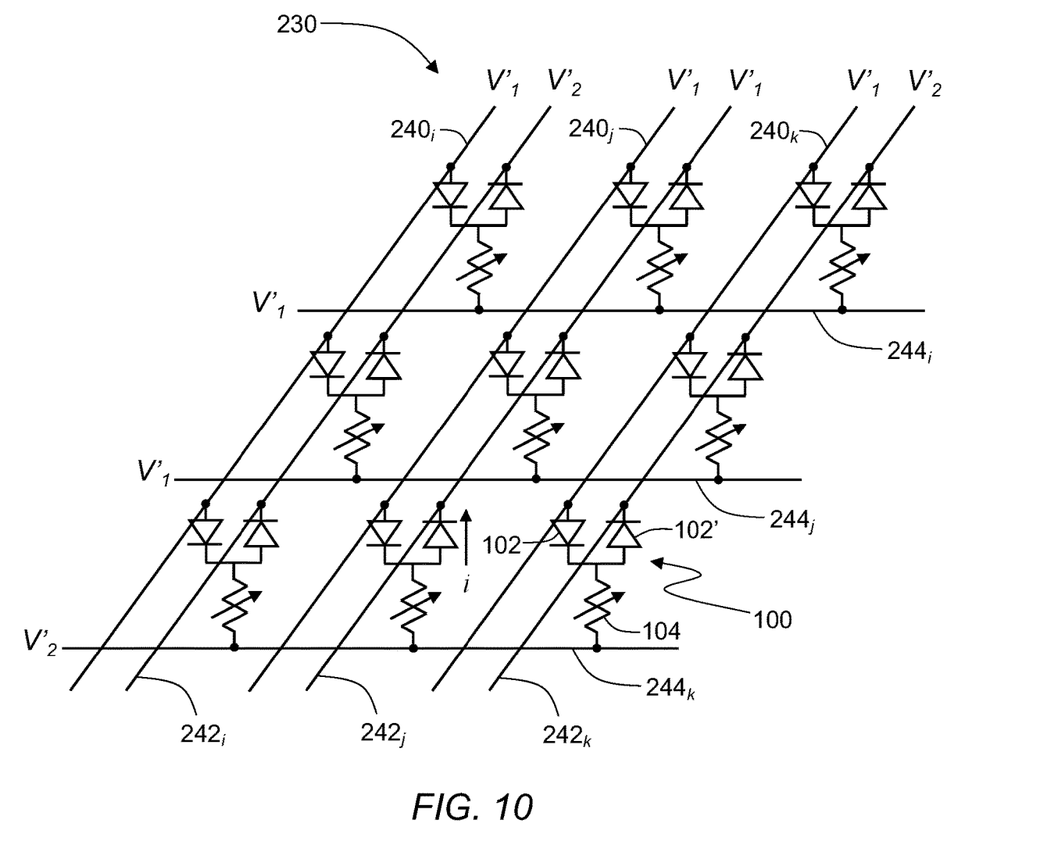
FIG. 10 is a schematic circuit diagram of the nonvolatile memory array incorporating the memory cells of the present invention that illustrates another method for flowing an opposite current through the selected memory cell.

FIG. 10 shows that the direction of the current (i) through the selected cell may be reversed by applying voltages of $V'_1$ and $V'_2$, to the second and third conductive lines $242_j$ and $244_k$, respectively. The voltage difference between $V'_2$, and $V'_1$ (i.e., $V'_2$–$V'_1$) is sufficiently high to make the second unidirectional selector 102' conductive. All other second conductive lines $242_i$, $242_k$ are held at $V'_2$. All other third conductive lines $244_i$, $244_j$ and all first conductive lines $240_i$-$240_k$ are held at $V'_1$.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112(f). In particular, the use of "step of" in the claims herein is not intended to invoke the provisions of 35 U.S.C. § 112(f).

What is claimed is:

1. A memory cell including:
    a nonvolatile memory element;
    first and second unidirectional selectors coupled in parallel to the nonvolatile memory element, each of the first and second unidirectional selectors including:
        first, second, and third electrode layers;
        a first insulator layer interposed between the first and second electrode layers; and
        a second insulator layer interposed between the second and third electrode layers,
    wherein the first insulator layer of the first unidirectional selector includes therein a permanent conductive path and the second insulator layer of the first unidirectional selector is operable to form therein a volatile conductive path upon application of a potential across the first unidirectional selector,
    wherein the second insulator layer of the second unidirectional selector includes therein another permanent conductive path and the first insulator layer of the second unidirectional selector is operable to form therein another volatile conductive path upon application of another potential across the second unidirectional selector, and
    wherein the first and second insulator layers of the first unidirectional selector are coplanar with the first and second insulator layers of the second unidirectional selector, respectively.

2. The memory cell of claim 1, wherein the first and second unidirectional selectors are configured to direct opposite currents, respectively.

3. The memory cell of claim 1, wherein the first and second insulator layers of the first unidirectional selector comprise first and second oxides, respectively.

4. The memory cell of claim 3, wherein the permanent conductive path in the first insulator layer of the first unidirectional selector includes a nonstoichiometric oxide filament with oxygen deficiency.

5. The memory cell of claim 3, wherein each of the first and second oxides is stochiometric or near-stochiometric.

6. The memory cell of claim 3, wherein each of the first and second oxides includes any one of hafnium oxide, tantalum oxide, zirconium oxide, titanium oxide, niobium oxide, or silicon oxide.

7. The memory cell of claim 1, wherein the first and second insulator layers of the second unidirectional selector comprise first and second oxides, respectively.

8. The memory cell of claim 7, wherein the another permanent conductive path in the second insulator layer of the second unidirectional selector includes a nonstoichiometric oxide filament with oxygen deficiency.

9. The memory cell of claim 7, wherein each of the first and second oxides is stochiometric or near-stochiometric.

10. The memory cell of claim 7, wherein each of the first and second oxides includes any one of hafnium oxide, tantalum oxide, zirconium oxide, titanium oxide, niobium oxide, or silicon oxide.

11. The memory cell of claim 1, wherein each of the second electrode layer of the first unidirectional selector and the second electrode layer of the second unidirectional selector comprises any one of copper, silver, nickel, or cobalt.

12. The memory cell of claim 1, wherein each of the second electrode layer of the first unidirectional selector and the second electrode layer of the second unidirectional selector has a composite structure including a plurality of conductive particles embedded in a semiconducting or insulating matrix.

13. The memory cell of claim 12, wherein the plurality of conductive particles comprise any one of copper, silver, nickel, or cobalt.

14. The memory cell of claim 1, wherein each of the first and third electrode layers of the first and second unidirectional selectors comprises any one of titanium nitride, iridium, platinum, or palladium.

15. The memory cell of claim 1, wherein the nonvolatile memory element comprises a magnetic tunnel junction (MTJ).

* * * * *